(12) United States Patent
Elsayed (10) Patent No.: US 11,095,275 B1
(45) Date of Patent: Aug. 17, 2021

(54) LOADABLE TRUE-SINGLE-PHASE-CLOCKING FLOP

(71) Applicant: SHENZHEN GOODIX TECHNOLOGY CO., LTD., Shenzhen (CN)

(72) Inventor: Mohamed Elsayed, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/164,722

(22) Filed: Feb. 1, 2021

(51) Int. Cl.
  *H03K 3/356* (2006.01)
  *H03K 3/037* (2006.01)
  *H03K 3/012* (2006.01)

(52) U.S. Cl.
  CPC ....... *H03K 3/356191* (2013.01); *H03K 3/012* (2013.01); *H03K 3/037* (2013.01)

(58) Field of Classification Search
  CPC ...... H03K 3/012; H03K 3/037; H03K 3/0375; H03K 3/356; H03K 3/356086; H03K 3/359095; H03K 3/356182; H03K 3/356191
  See application file for complete search history.

(56) References Cited

U.S. PATENT DOCUMENTS

| 6,822,495 | B2* | 11/2004 | Larsson | H03K 19/0963 327/200 |
| 7,583,123 | B2* | 9/2009 | Kanda | H03K 3/356113 327/218 |
| 8,994,431 | B2* | 3/2015 | Chang | H03K 3/356191 327/218 |
| 9,924,466 | B1* | 3/2018 | Leuciuc | H04W 52/029 |

* cited by examiner

*Primary Examiner* — Patrick O Neill
(74) *Attorney, Agent, or Firm* — Kilpatrick Townsend & Stockton LLP (57) ABSTRACT

Techniques are described for implementing a true-single-phase-clocking (TSPC) flop with loading functionality. For example, the loadable TSPC flop can receive input signals, including at least a clock input signal, a SET signal, and a RESET signal. Responsive to one configuration of the input signals, the loadable TSPC flop operates in a normal mode, in which its output node toggles responsive to the clock input signal. Responsive to another configuration of the input signals, the loadable TSPC flop operates in a reset loading mode, such that the Qb output node is loaded and held to a predetermined reset value. Responsive to another configuration of the input signals, the loadable TSPC flop operates in a set loading mode, such that the Qb output node is loaded and held to a predetermined set value that is a complement of the predetermined reset value.

18 Claims, 7 Drawing Sheets

LOADABLE TRUE-SINGLE-PHASE-CLOCKING FLOP

FIELD

The invention relates generally to electronic circuits. More particularly, embodiments relate to true-single-phase-clocking (TSPC) flop circuits with loading, such as for use in high-speed clocking and counting circuits.

BACKGROUND

Many electronic circuits rely on high-speed clocking. For example, counters are used in complementary metal-oxide semiconductor (CMOS) image sensor (CIS) pixels to convert a detected analog signal intensity into a representative digital value. For many typical application, such as smartphones and other consumer electronics, huge numbers of pixels (e.g., millions or more) are packed into the CIS, and it is desirable to perform the analog-to-digital conversions at very high speeds with very low resource consumption (i.e., consuming minimal power and area). Some such applications use so-called "true-single-phase-clocking" (TSPC) flops to support such high-speed clocking. For example, TSPC flops can be implemented in frequency divider blocks of high-speed phase-lock loop (PLL) circuits, or the like.

As compared to other typical approaches (e.g., other clocked CMOS logic circuits, such as other types of flip-flops), TSPC flops can operate at very high speeds with relatively low power and area consumption. However, because such TSPC flops are typically implemented in an always-running circuit (e.g., a clock PLL, which tends to be running, except when the system is powered off), there tends to be no need to load the TSPC flop with a particular state and to maintain the output at the particular state (e.g., HIGH or LOW). Further, TSPC flops typically rely on having high-impedance nodes, which tends to limit the time in which the flop nodes are not toggling. As such, there tends to be a minimum frequency that the TSPC flop can handle, and the TSPC flop may not operate properly below that frequency.

BRIEF SUMMARY OF THE INVENTION

Embodiments provide true-single-phase-clocking (TSPC) flop circuits that support loading functionality with minimal impact to maximum clock speed. For example, a novel loadable TSPC flop can receive input signals, including at least a clock input signal, a SET signal, and a RESET signal. Responsive to one configuration of the input signals, the loadable TSPC flop operates in a normal mode, in which its output node toggles responsive to the clock input signal (e.g., similar to a conventional always running configuration for a clock divider, or the like). Responsive to another configuration of the input signals, the loadable TSPC flop operates in a reset loading mode, such that the Qb output node is loaded and held to a predetermined reset value. Responsive to another configuration of the input signals, the loadable TSPC flop operates in a set loading mode, such that the Qb output node is loaded and held to a predetermined set value that is a complement of the predetermined reset value.

According to one set of embodiments, a loadable true-single-phase-clocking (TSPC) flop is provided. The loadable TSPC flop includes: a set of input nodes to receive an input clock signal and control signals, the control signals including a SET signal and a RESET signal, the set of control signals configurable to direct the loadable TSPC flop into a selected one of a normal mode, a reset loading mode, or a set loading mode; an input circuit block coupled between a data input node and a first intermediate node; an output circuit block coupled between a second intermediate node and an output node; and a loadable pre-charge circuit block, having a precharge network and a set/reset toggle block, coupled between the first intermediate node and the second intermediate node, wherein the set of control signals direct the loadable TSPC flop into the normal mode by at least setting the precharge network to a running mode and setting the S/R toggle block to an off mode, such that the output node toggles responsive to the clock input signal, wherein the set of control signals direct the loadable TSPC flop into the reset loading mode by at least setting the S/R toggle block to a reset toggle mode, such that the output node is loaded to a predetermined reset value, and wherein the set of control signals direct the loadable TSPC flop into the set loading mode at least by setting the S/R toggle block to a set toggle mode, such that the output node is loaded to a predetermined set value that is a complement of the predetermined reset value.

According to another set of embodiments, a method is provided for generating TSPC flop functionality with selectable loading. The method includes: obtaining, by a loadable TSPC flop, a clock input signal and a set of control signals, including a SET signal and a RESET signal, the loadable TSPC flop having a data input node and an output node, the set of control signals configured to place the loadable TSPC flop in a selected one of a normal mode, a reset loading mode, or a set loading mode; responsive to the set of control signals configured to place the loadable TSPC flop in the normal mode, setting a precharge network of the loadable TSPC flop to a running mode and setting a S/R toggle block of the loadable TSPC flop to an off mode, such that the output node toggles responsive to the clock input signal; responsive to the set of control signals configured to place the loadable TSPC flop in the reset loading mode, setting the S/R toggle block to a reset toggle mode, such that the output node is loaded to a predetermined reset value; and responsive to the set of control signals configured to place the loadable TSPC flop in the set loading mode, setting the S/R toggle block to a set toggle mode, such that the output node is loaded to a predetermined set value that is a complement of the predetermined reset value.

According to another set of embodiments, another method is provided for generating TSPC flop functionality with selectable loading. The method includes: obtaining, by a controller coupled with a loadable TSPC flop, a set of load inputs indicating an operating mode for the loadable TSPC flop, the operating mode being selected from a plurality of modes comprising a normal mode, a reset loading mode, or a set loading mode; generating, by the controller responsive to the obtaining, a set of control signals including a SET signal and a RESET signal, each control signal generated to have a respective state configured to place the loadable TSPC flop in the operating mode; and communicating the set of control signals to the loadable TSPC flop, such that: responsive to the set of control signals configured to place the loadable TSPC flop in the normal mode, the control signals cause a precharge network of the loadable TSPC flop to be set to set to a running mode and cause a S/R toggle block of the loadable TSPC flop to be set to an off mode, such that an output node of the loadable TSPC flop toggles responsive to the clock input signal; responsive to the set of control signals configured to place the loadable TSPC flop in the reset loading mode, the control signals cause the S/R toggle block to be set to a reset toggle mode, such that the output node is loaded to a predetermined reset value; and responsive to the set of control signals configured to place the loadable TSPC flop in the set loading mode, the control signals cause the S/R toggle block to be set to a set toggle mode, such that the output node is loaded to a predetermined set value that is a complement of the predetermined reset value.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
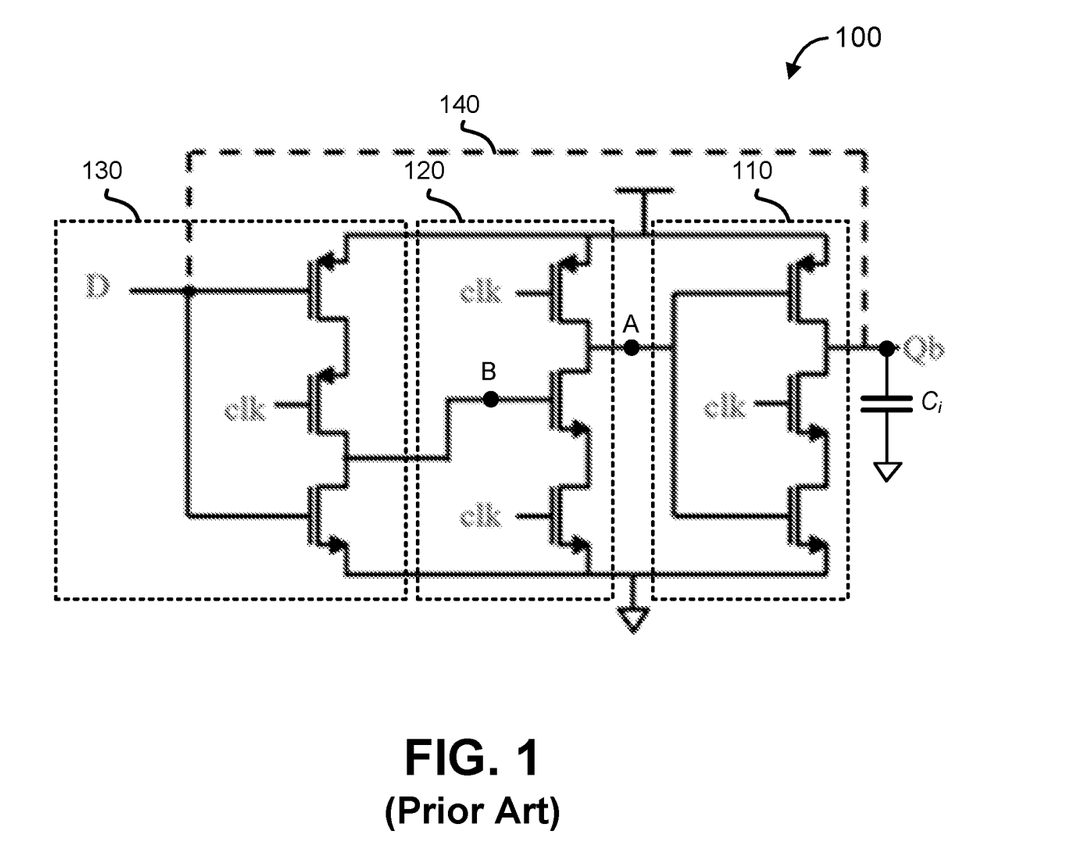
FIG. 1 shows an illustrative conventional true-single-phase-clocking (TSPC) flop.

FIG. 1 shows an illustrative conventional true-single-phase-clocking (TSPC) flop 100. As illustrated, the conventional TSPC flop 100 includes a data (D) input, a clock (CLK) input, and a "Q-bar" output (Qb). Operation of the TSPC flop 100 can be described as three sub-circuits. A first sub-circuit 110 is configured essentially as a latch that drives Qb at its output based on CLK and intermediate node A. When CLK is HIGH, the first sub-circuit 110 essentially reduces to an inverter: Qb is the complement of A. When CLK is LOW, the first sub-circuit 110 is essentially in a store mode: the state of A is retained, so long as the state of A does not transition from HIGH to LOW. A second sub-circuit 120 is essentially a "Domino" stage configured to precede the first sub-circuit 110 to drive A based on CLK and another intermediate node B. A third sub-circuit 130 is configured essentially as another inverter to drive B at its output based on CLK and D.

For example, in each half-cycle of the clock, when CLK is LOW, the third sub-circuit 130 acts as an inverter, and the state of node B is the complement of D. Because CLK is LOW, this also turns on the upper PMOS transistor in the second sub-circuit 120, which pulls node A to a HIGH state (regardless of the state of node B). Because A is now HIGH, and CLK is LOW, the state of Qb is essentially unaffected (the transistors coupled to the Qb node are OFF). As such, node A is considered essentially as being precharged to the HIGH voltage reference (e.g., Vdd) during each half-cycle of the clock. This can be referred to as a "pre-charge" stage.

In each other half-cycle of the clock, when the state of CLK transitions to HIGH, the value of Qb becomes dependent on D. In particular, if D is LOW when CLK goes HIGH, the state of node B will already be HIGH (i.e., the complement of D) from the preceding pre-charge stage and is essentially latched in that state. With node B and CLK both HIGH in the second sub-circuit 120, node A gets pulled down to a LOW state. That effectively turns on the upper PMOS transistor in the first sub-circuit 110, causing Qb to be pulled HIGH (e.g., thereby charging Ci). If D is HIGH when CLK goes HIGH, the state of node B will already be LOW from the preceding pre-charge stage and is essentially latched in that state. With a LOW node B state and a HIGH CLK state in the second sub-circuit 120, node A stays in the HIGH state. With node A and CLK both HIGH in the first sub-circuit 110, node Qb gets pulled down to a LOW state, causing Qb to be pulled LOW (e.g., thereby discharging Ci).

In some implementations, the Qb output node is coupled back to the D input node via path 140. In such a configuration, each pre-charge stage will effectively maintain the state of Qb from the half-cycle preceding the pre-charge state, but the feedback of Qb will then cause the state of Qb to toggle in the next half-cycle following the pre-charge state. As such, Qb will effectively toggle at half the rate of the clock. Such a circuit can thus be used to divide the clock frequency by two.

It can be seen that TSPC flops can support high-speed clocking applications. As compared to other conventional approaches (e.g., other clocked CMOS logic circuits, such as other types of flip-flops), such TSPC flops can operate at such high speeds with relatively low power and area consumption. However, conventional TSPC flops have certain limitations. One such limitation is that TSPC flops typically rely on having high-impedance nodes, which tends to limit the time in which the flop nodes are not toggling. Similarly, conventional TSPC flops tend to experience appreciable current leakage, such that TSPC nodes tend not to be able to reliably hold any particular value. For at least these reasons, TSPC flops typically have a minimum frequency, below which the TSPC flop may not operate properly. As such, TSPC flops tend to be implemented in "always-running" types of circuits, such as in frequency divider blocks of high-speed phase-lock loop (PLL) circuits, where the TSPC flops tend to operate continuously, except when the system is powered off. Such conventional implementations do not provide any way to load the TSPC flop with a particular state (e.g., HIGH or LOW) and/or to maintain its output at the particular state.

Figure 2:
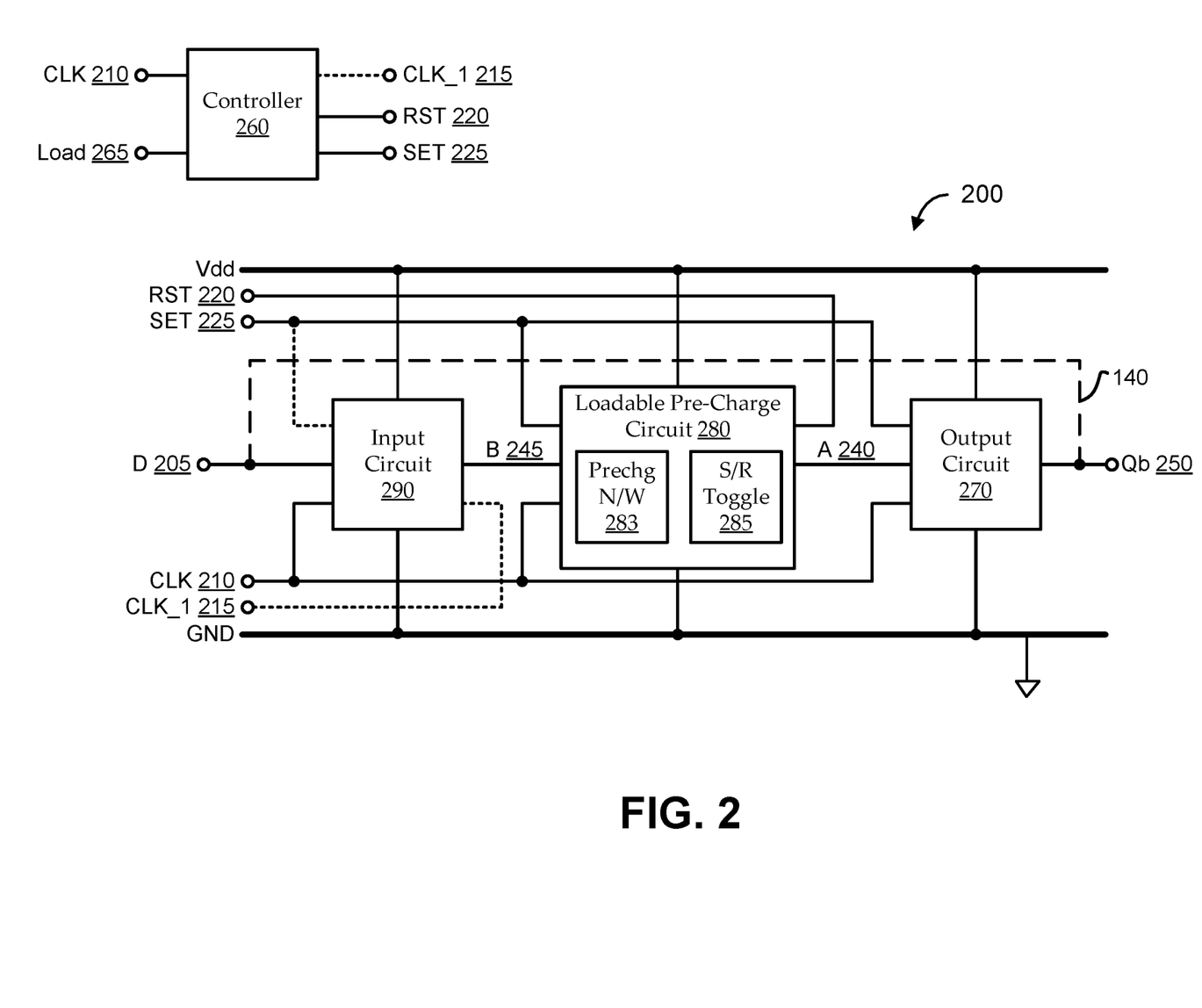
FIG. 2 shows a circuit block diagram of an illustrative loadable TSPC flop, according to embodiments described herein.

Embodiments described herein provide a novel type of TSPC flop that supports loading. Embodiments can be implemented in a manner that does not appreciably impact the maximum operating frequency of the TSPC flop. FIG. 2 shows a circuit block diagram of an illustrative loadable TSPC flop 200, according to embodiments described herein. The loadable TSPC flop 200 can be configured to operate in a "loading" state or a "normal" state. Similar to the conventional TSPC flop 100 of FIG. 1, the loadable TSPC flop 200 of FIG. 2 includes a D input node 205, a Qb output node 250, a first intermediate node (A) 240, and a second intermediate node (B) 245. The loadable TSPC flop 200 also receives various signals as inputs, including an input clock signal (CLK) 210, a set signal (SET) 225, and a reset signal (RST) 220. Some embodiments receive additional signals, such as a "CLK_1" signal 215, which is always LOW when the loadable TSPC flop 200 is operating in the normal state, and follows CLK 210 when the loadable TSPC flop 200 is operating in the loading state. As described with reference to FIG. 1, embodiments can be implemented in a divider configuration by coupling the Qb output node 250 back to the D input node 205 via path 140 (shown as a dashed line).

As illustrated, the loadable TSPC flop 200 can be described as an output circuit block 270, a loadable precharge circuit block 280, and an input circuit block 290. For context, the blocks are shown in communication with a controller 260. The controller 260 may or may not be part of the loadable TSPC flop 200. Embodiments of the loadable pre-charge circuit block 280 can include a set/reset (S/R) toggle block 285, which can selectively operate in a "set" toggle state, a "reset" toggle state, or an "off" toggle state. Each of the circuit blocks can be further coupled with a voltage reference rail (Vdd) and a ground rail (GND), and with the input clock signal (CLK) 210. The controller 260 can be responsive to a LOAD signal 265 to control the state of at least RST 220 and SET 225, thereby controlling the states of components of the loadable TSPC flop 200, and effectively configuring the loadable TSPC flop 200 into a selected one of multiple modes of operation. When in the normal state, the controller 260 can configure the loadable TSPC flop 200 to operate substantially in the manner of the conventional TSPC flop 100 of FIG. 1. When in the loading state, the controller 260 can configured the loadable TSPC flop 200 selectively into one of multiple loading modes of operation. The multiple loading modes of operation can include at least a "set" loading mode to effectively load the loadable TSPC flop 200 with a first output value (e.g., '0'), and a "reset" loading mode to effectively load the loadable TSPC flop 200 with a second output value that is complementary to the first output value (e.g., '1').

Embodiments of the loadable pre-charge circuit block 280 can include a precharge network 283 and a set/reset (S/R) toggle block 285. The S/R toggle block 285 can selectively operate in a "set" toggle state, a "reset" toggle state, or an "off" toggle state. In some embodiments, the controller 260 configures the loadable TSPC flop 200 to operate in the normal state at least by configuring the precharge network 283 into a running state and configuring the S/R toggle block 285 into the off toggle state.

Some embodiments of the controller 260 configure the loadable TSPC flop 200 to operate in the reset loading mode at least by configuring the precharge network 283 into a hold state and configuring the S/R toggle block 285 to the reset toggle state. Configuring the S/R toggle block 285 to the reset toggle state can at least partially cause the loadable pre-charge circuit block 280 to pull down node A 240, and at least partially cause the output circuit block 270 to pull up Qb output node 250 and to pull up D input node 205 in feedback. This can further cause the input circuit block 290 to pull node B 245 down in some configurations, which can help the precharge network 283 to remain in the hold state, even with a change in the state of CLK 210.

Some embodiments of the controller 260 configure the loadable TSPC flop 200 to operate in the set loading mode at least by configuring the precharge network 283 into the hold state and configuring the S/R toggle block 285 to the set toggle state. Configuring the S/R toggle block 285 to the set toggle state can at least partially cause the loadable precharge circuit block 280 to pull up node A 240, and at least partially cause the output circuit block 270 to pull down Qb output node 250 and to pull down D input node 205 in feedback. This can further cause the input circuit block 290 to control node B 245 so as to help configure the precharge network 283 to remain in the hold state, even with a change in the state of CLK 210.

Figure 3:
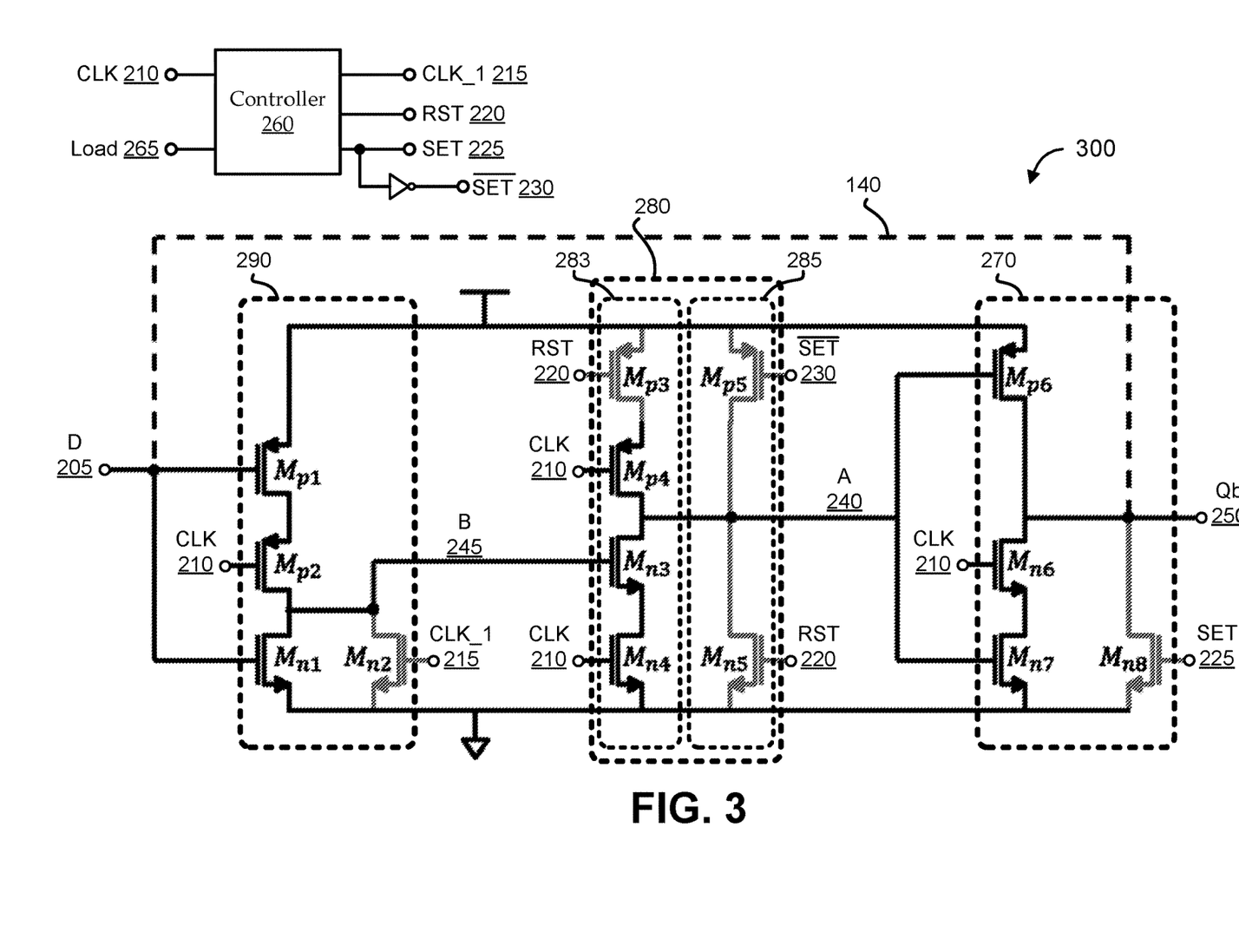
FIG. 3 shows a circuit diagram of an illustrative loadable TSPC flop, according to embodiments described herein.
Figure 4:
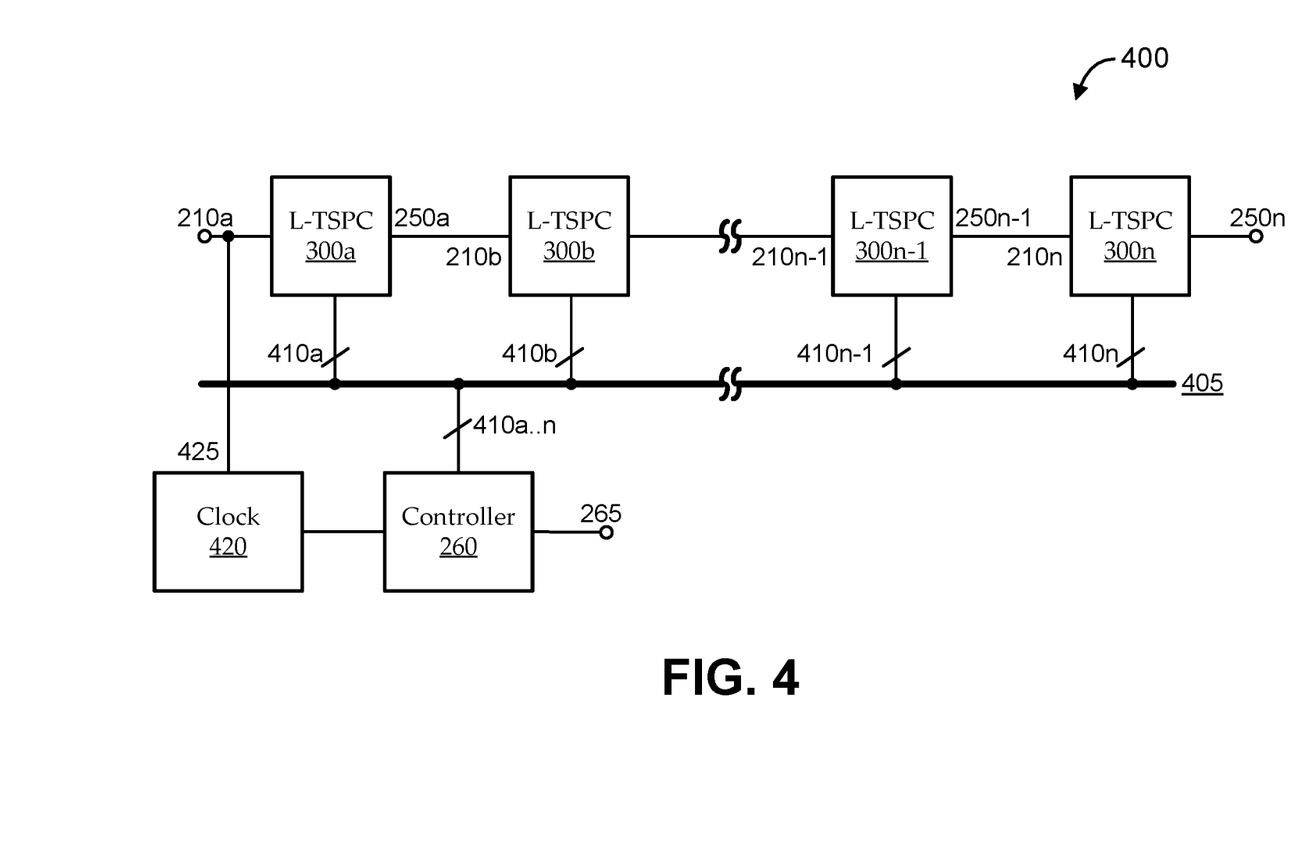
FIG. 4 shows a simplified circuit block diagram of multiple of the loadable TSPC flops of FIG. 3 coupled in a chain configuration.
Figure 5:
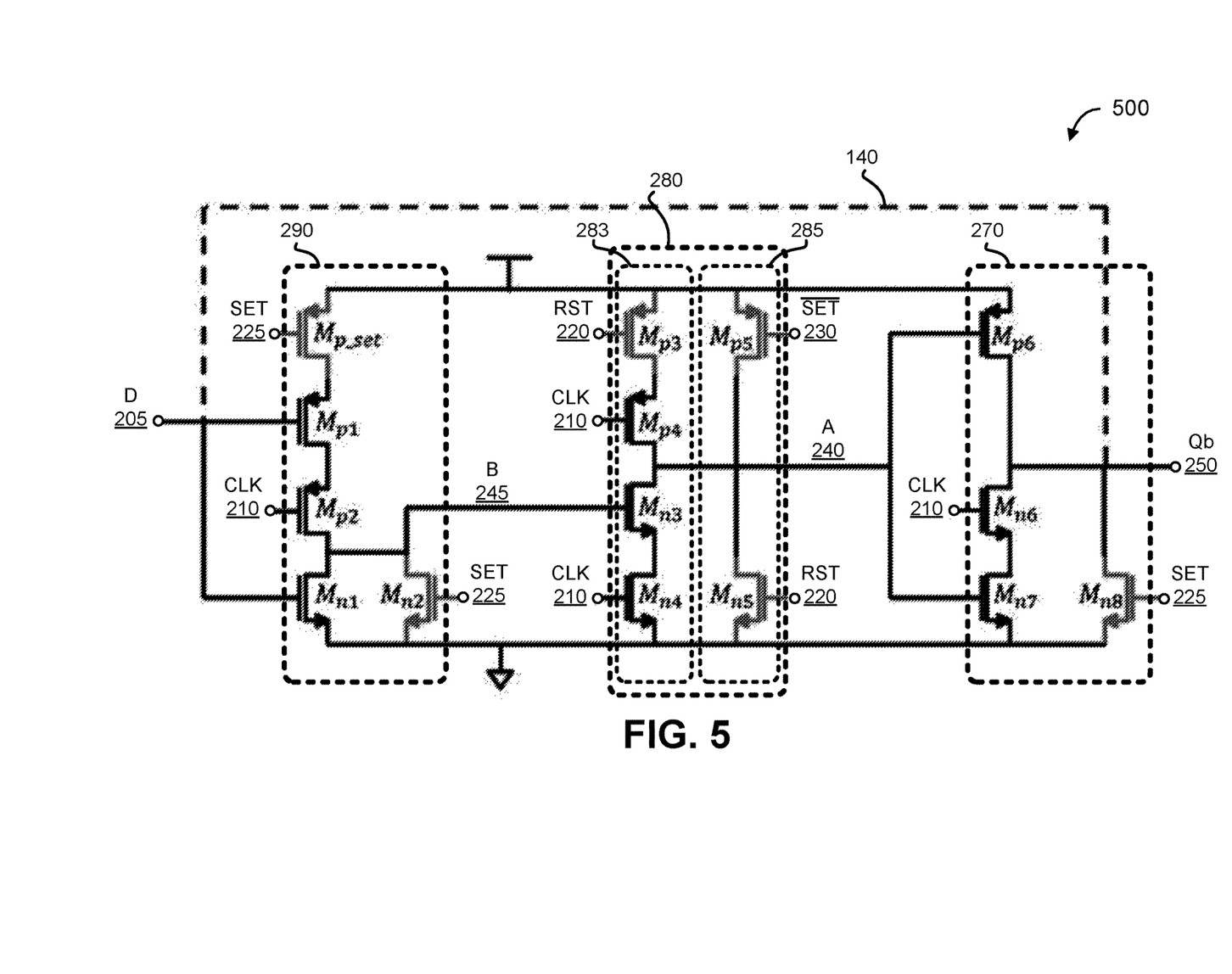
FIG. 5 shows a circuit diagram of another illustrative loadable TSPC flop with clock-independent load operation, according to embodiments described herein.

The various components of the loadable TSPC flop 200 can be implemented in any suitable manner to provide the features described herein. Some examples of such implementations are shown in FIGS. 3-5. These examples are not intended to cover all possible implementations, but are intended to represent selected implementations. Circuits are described herein in relatively simplified form to avoid over-complicating the disclosure and distracting from the inventive features. Further, many modifications can be made to the illustrated and described circuits by those of skill in the art without departing from the scope of the inventions described herein. For example, in either of the circuits of FIGS. 3 and 5, the order of M_p3 and M_p4 can be flipped without appreciably impacting the performance or functionality of the circuits. Reference to particular binary values herein should be construed as exemplary and non-limiting. For example, embodiments described herein can be modified by those of skill in the art within the scope of the inventions described herein, so that the "set" loading mode effectively preloads the loadable TSPC flop 200 with a '0', and the "reset" loading mode effectively preloads the loadable TSPC flop 200 with a '1'. Similarly, signals and components can be replaced with complementary signals and components without departing from the scope of the inventions described herein (e.g., if a HIGH signal is used to turn on an NMOS transistor, a complementary LOW signal can alternatively be used to turn on a PMOS transistor).

FIG. 3 shows a circuit diagram of an illustrative loadable TSPC flop 300, according to embodiments described herein. The loadable TSPC flop 300 can be an implementation of the loadable TSPC flop 200 of FIG. 2. The loadable TSPC flop 300 can be configured to operate in a "loading" state or a "normal" state, as described above. Similar to the description of FIG. 2, the loadable TSPC flop 300 includes a D input node 205, a Qb output node 250, a first intermediate node (A) 240, and a second intermediate node (B) 245; and the loadable TSPC flop 300 can receive various signals as inputs (e.g., from controller 260), including CLK 210, SET 225, and RST 220. Additional control signals can be provided by the controller 260 and/or generated by internal logic of the loadable TSPC flop 300 (or in any other suitable manner). For example, a set_bar signal 230 is a complement to SET 225, which can be output by the controller 260, or received as SET 225 by the loadable TSPC flop 300 and inverted by the loadable TSPC flop 300 to generate set_bar 230. Alternatively, embodiments can use SET 225 directly by using one or more complementary components (e.g., replacing PMOS transistor M_p5 with an NMOS transistor and/or other logic). Implementations of the loadable TSPC flop 300 can also receive a "CLK_1" signal 215, which is always LOW when the loadable TSPC flop 200 is operating in the normal state, and follows CLK 210 when the loadable TSPC flop 200 is operating in the loading state. As described with reference to FIG. 1, embodiments can be implemented in a divider configuration by coupling the Qb output node 250 back to the D input node 205 via path 140.

As illustrated, the loadable TSPC flop 300 includes at least five transistors that are not present in the conventional TSPC flop 100: M_n2, M_p3, M_n5, M_p5, and M_n8. M_n2 is driven by (i.e., its gate is coupled to) CLK_1 215, M_p3 and M_n5 are driven by RST 220, M_p5 is driven by set_bar 230, and M_n8 is driven by SET 225. For added clarity, transistors of the loadable TSPC flop 300 are grouped into corresponding circuit blocks of FIG. 2, including an output circuit block 270, a loadable pre-charge circuit block 280 (including a precharge network 283 and a S/R toggle block 285), and an input circuit block 290. A controller 260 can be responsive to a LOAD signal 265 to control the state of at least clk_1 215, RST 220, and SET 225, thereby controlling the states of transistors of the loadable TSPC flop 300, and effectively configuring the loadable TSPC flop 300 into a selected one of multiple modes of operation.

For example, the following state table defines five operating states for the loadable TSPC flop 300:

| Load 265 | D 205 | CLK 210 | SET 225 | Set_bar 230 | RST 220 | Clk_1 215 |
|---|---|---|---|---|---|---|
| 0 | X | X | 0 | 1 | 0 | 0 |
| 1 | 1 | 0 | 0 | 1 | 1 | 0 |
| 1 | 0 | 0 | 1 | 0 | 0 | 0 |
| 1 | 1 | 1 | 0 | 1 | 1 | 1 |
| 1 | 0 | 1 | 1 | 0 | 0 | 1 |

The first operating mode, corresponding to the first row of the table and to load 265 being set to LOW ('0'), is the normal operating state. In this normal operating state, it can be seen that M_p3 is ON, and all of M_n2, M_n5, M_p5, and M_n8 are off. This configures the loadable TSPC flop 300 in a normal (e.g., always running mode, similar to conventional operation) by effectively removing the effect of all the additional transistors. In order to minimize the effect of loading functionality on circuit speed, M_n2, M_n5, M_p5, and M_n8 can be implemented as minimum size transistors. Since M_p3 is in series with M_p4, M_p3 can be sized with a relatively large width. Notably, when M_p3 is ON, its drain and source are connected to the supply. As such, any parasitic capacitance associated with M_p3 does not impact the speed of the loadable TSPC flop 300.

The second operating mode corresponds to the second row of the table and to a resetting of the loadable TSPC flop 300 with CLK 210 (the input clock) being LOW. This can be considered as a low-clock reset loading mode (i.e., a reset loading mode when the clock 210 is LOW). In this mode, RST 220 is HIGH (and SET 225 is LOW), which turns off transistor M_p3 and turns on M_n5. This effectively pulls down node A 240. Since A 240 is LOW, Qb output node 250 goes HIGH. That pulls D input node 205 HIGH, which pulls down node B 245.

The third operating mode corresponds to the third row of the table and to a setting of the loadable TSPC flop 300 with CLK 210 being LOW. In this mode, SET 225 is HIGH (and RST 220 is LOW), which turns on transistor M_p5 and pulls up node A 240. This can be considered as a low-clock set loading mode (i.e., a set loading mode when the clock 210 is LOW). Additionally, the HIGH state of SET 225 turns on M_n8, which pulls down Qb output node 250, and pulls down D input node 205, accordingly. With both D input node 205 and CLK 210 in a LOW state, A 240 is pulled up to HIGH.

The fourth operating mode corresponds to the fourth row of the table and to a resetting of the loadable TSPC flop 300 with CLK 210 being HIGH. This can be considered as a high-clock reset loading mode (i.e., a reset loading mode when the clock 210 is HIGH). As in the other reset mode (the second operating mode), RST 220 is HIGH (and SET 225 is LOW). Again, this turns off transistor M_p3 and turns on M_n5, thereby pulling down node A 240. Since A 240 is LOW, Qb output node 250 goes HIGH, D input node 205 is pulled HIGH, and node B 245 is pulled LOW.

The fifth operating mode corresponds to the fifth row of the table and to a setting of the loadable TSPC flop 300 with CLK 210 being HIGH. This can be considered as a high-clock set loading mode (i.e., a set loading mode when the clock 210 is HIGH). In this mode, SET 225 is HIGH (so set_bar 230 is LOW) and RST 220 is LOW, which turns on M_p5 and turns off M_n5, thereby pulling up node A 240. The HIGH state of SET 225 also turns on M_n8, which pulls down Qb output node 250 and pulls down D input node 205.

As noted above, Clk_1 215 is always LOW when the loadable TSPC flop 300 is operating in the normal state, and indicates the state of CLK 210 when the loadable TSPC flop 300 is operating in the loading state. As such, Clk_1 215 can affect operation of the loadable TSPC flop 300 in the fourth and fifth operating modes. For example, in both the fourth and fifth operating modes, the HIGH state of Clk_1 215 turns on M_n2, which pulls down node B 245 and turns off transistor M_n3.

In some embodiments, multiple loadable TSPC flops 300 are chained together, for example, for use in a ripple counter/divider configuration. FIG. 4 shows a simplified circuit block diagram 400 of multiple of the loadable TSPC flops 300 of FIG. 3 coupled in a chain configuration. As illustrated, some positive integer number (N) of loadable TSPC flops 300 (L-TSPCs) are included in the chain. Each is coupled with a controller 260 via a bus 405 (or in any other suitable manner). The controller 260 can control the state of various signals 410, such as SET 225, RST 220, and Clk_1 215. As described with reference to FIG. 2, the control signals 410 can be used to load each loadable TSPC flop 300 into a particular operating mode (in the loading state), and/or to allow each loadable TSPC flop 300 to operate in the normal state. The first loadable TSPC flop 300a has its clock input 210a coupled with an input clock source 420 (e.g., any suitable clock generator) to receive an input clock signal 425. For all other loadable TSPC flops 300 in the chain, the clock input 210 of the loadable TSPC flop 300 is coupled with the output node 250 (e.g., Q bar) of the previous loadable TSPC flop 300 in the chain. Further, though not shown, each loadable TSPC flop 300 may have its output coupled back to its data input 205.

In the loading state, the controller 260 can use the control signals 410 to set the state of the Qb output node 250 of any particular loadable TSPC flop 300, regardless of the state of CLK 210. For example, in the loading state, Qb output node 250 is '1' (HIGH) when SET 225 is HIGH and RST 220 is LOW, and Qb output node 250 is '0' (LOW) when SET 225 is LOW and RST 220 is HIGH. In this way, the controller 260 can set the states of control signals 410 for one or more of the loadable TSPC flops 300 in the chain. For example, a chain of N loadable TSPC flops 300 can effectively be loaded with a N-bit value by controlling the states of the control signals.

In the illustrated configuration, the Qb output node 250 of each loadable TSPC flop 300 is coupled with the clock input node 210 of each subsequent loadable TSPC flop 300. In operation, each nth loadable TSPC flop 300n will have a Qb output node 250n that toggles at half the rate of that of the (n−1)th (i.e., preceding) loadable TSPC flop 300(n−1). Clk_1 215 can be used to help ensure proper operation of such a configuration. In such a configuration, Clk_1 215 of each loadable TSPC flop 300n will effectively correspond to RST 220 of the preceding loadable TSPC flop 300(n−1).

FIG. 5 shows a circuit diagram of another illustrative loadable TSPC flop 500 with clock-independent load operation, according to embodiments described herein. The loadable TSPC flop 500 can be an implementation of the loadable TSPC flop 200 of FIG. 2. The loadable TSPC flop 500 can be configured to operate in a "loading" state or a "normal" state, as described above. Similar to the description of FIG. 2, the loadable TSPC flop 500 includes a D input node 205, a Qb output node 250, a first intermediate node (A) 240, and a second intermediate node (B) 245; and the loadable TSPC flop 500 can receive various signals as inputs (e.g., from controller 260, not shown), including CLK 210, SET 225, and RST 220. As described with reference to FIG. 1, embodiments can be implemented in a divider configuration by coupling the Qb output node 250 back to the D input node 205 via path 140.

As illustrated, the loadable TSPC flop 500 includes at least six transistors that are not present in the conventional TSPC flop 100: M_n2, M_p3, M_n5, Mp_5, M_n8, and M_p_set. For added clarity, transistors of the loadable TSPC flop 500 are grouped into corresponding circuit blocks of FIG. 2, including an output circuit block 270, a loadable pre-charge circuit block 280 (including a precharge network 283 and a S/R toggle block 285), and an input circuit block 290. As in the loadable TSPC flop 300 of FIG. 3, M_p3 and M_n5 are driven by RST 220, M_p5 is driven by set_bar 230, and M_n8 is driven by SET 225. Instead of driving M_n2 with CLK_1 215, as in FIG. 3, the loadable TSPC flop 500 uses SET 225 to drive M_n2 and the added M_p_set, both in the input circuit block 290. Because the loading state of the loadable TSPC flop 500 is clock-independent, there may only be a single reset loading mode and a single set loading mode. For example, the following state table defines three operating states for the loadable TSPC flop 500:

| Load 265 | D 205 | CLK 210 | SET 225 | Set_bar 230 | RST 220 |
|---|---|---|---|---|---|
| 0 | X | X | 0 | 1 | 0 |
| 1 | 1 | X | 0 | 1 | 1 |
| 1 | 0 | X | 1 | 0 | 0 |

The first operating mode, corresponding to the first row of the table and to load 265 being set to LOW ('0'), is the normal operating state. In this normal operating state, it can be seen that, with SET 225 HIGH and RST 220 LOW: M_p3 is on, effectively placing the precharge network 283 of the loadable pre-charge circuit block 280 in the running state; M_n5 and M_p5 are both off, effectively placing the S/R toggle block 285 of the loadable pre-charge circuit block 280 in the off toggle state; and M_n2 and M_n8 are off, and M_p_set is on, effectively placing the input circuit block 290 and the output circuit block 270 into their respective conventional configurations.

The second operating mode corresponds to the second row of the table and to a resetting of the loadable TSPC flop 500. In this mode, RST 220 is HIGH and SET 225 is LOW. In this configuration, the S/R toggle block 285 is effectively set to pull down node A 240 through M_n5, regardless of the state of CLK 210. Since node A 240 is LOW (and SET 225 is LOW, turning off M_n5), the output circuit block 270 is configured to pull Qb output node 250 HIGH through M_p6, regardless of the state of CLK 210. With Qb output node 250 coupled to D input node 205, this further pulls D input node 205 HIGH at the input to the input circuit block 290, which pulls node B 245 down through M_n1, regardless of the state of CLK 210. The LOW state of node B 245 turns off M_n3, and the HIGH state of RST 220 turns off M_p3, thereby effectively removing the precharge network 283 from the circuit, regardless of the state of CLK 210.

The third operating mode corresponds to the third row of the table and to a setting of the loadable TSPC flop 500. In this mode, RST 220 is LOW and SET 225 is HIGH. In this configuration, the S/R toggle block 285 is effectively set to pull up node A 240 through M_p5, regardless of the state of CLK 210. Since node A 240 and SET 225 are both HIGH, M_p6 is off, and the output circuit block 270 is configured to pull Qb output node 250 LOW through M_n8, regardless of the state of CLK 210. With Qb output node 250 coupled to D input node 205, this further pulls D input node 205 LOW at the input to the input circuit block 290, which effectively turns off all the transistors of the input circuit block 290 other than M_n2, pulling node B 245 down through M_n2, regardless of the state of CLK 210.

Figure 6:
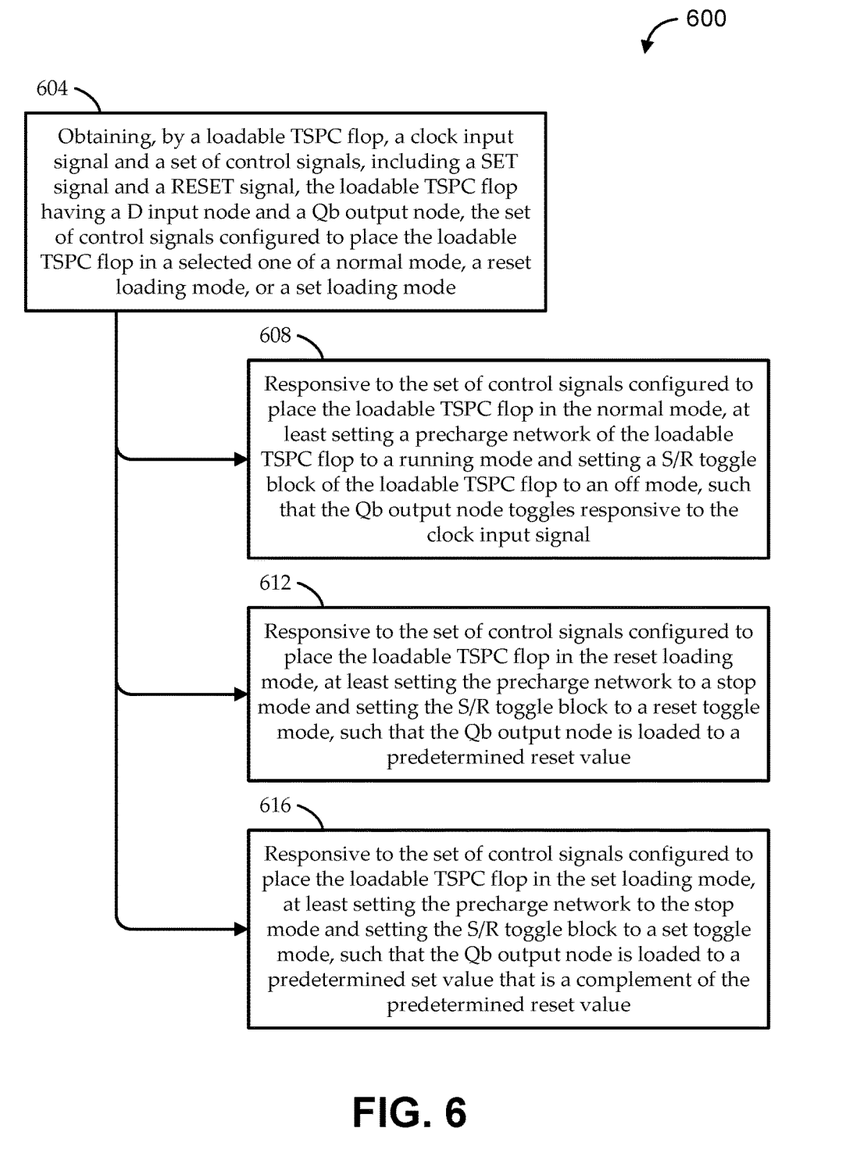
FIG. 6 shows a flow diagram of a method for generating TSPC flop functionality with optional loading, according to various embodiments.

FIG. 6 shows a flow diagram of a method 600 for generating TSPC flop functionality with optional loading, according to various embodiments. Embodiments of the method 600 can operate in context of any of the loadable TSPC flop implementations described above. For example, the loadable TSPC flop includes at least an input circuit block, a loadable pre-charge circuit block, and an output circuit block. The loadable pre-charge circuit block can include a precharge network and a set/reset (S/R) toggle block. The loadable TSPC flop can have a D input node and a Qb output node, and can be configured to receive a clock input signal and a set of control signals, including a SET signal and a RESET signal. Embodiments of the method 600 can begin at stage 604 by obtaining the clock input signal and the set of control signals by the loadable TSPC flop. For example, the signals can be obtained from a controller that is separate from the loadable TSPC flop and/or from internal logic of the loadable TSPC flop. The configuration of control signals can effectively configure the loadable TSPC flop into a selected one of a normal mode (stage 608), a reset loading mode (stage 612), or a set loading mode (stage 616).

At stage 608, responsive to the set of control signals configured to place the loadable TSPC flop in the normal mode, at least setting a precharge network of the loadable TSPC flop to a running mode and setting a S/R toggle block of the loadable TSPC flop to an off mode, such that the Qb output node toggles responsive to the clock input signal. At stage 612, responsive to the set of control signals configured to place the loadable TSPC flop in the reset loading mode, at least setting the precharge network to a stop mode and setting the S/R toggle block to a reset toggle mode, such that the Qb output node is loaded to a predetermined reset value. At least 616, responsive to the set of control signals configured to place the loadable TSPC flop in the set loading mode, at least setting the precharge network to the stop mode and setting the S/R toggle block to a set toggle mode, such that the Qb output node is loaded to a predetermined set value that is a complement of the predetermined reset value.

Figure 7:
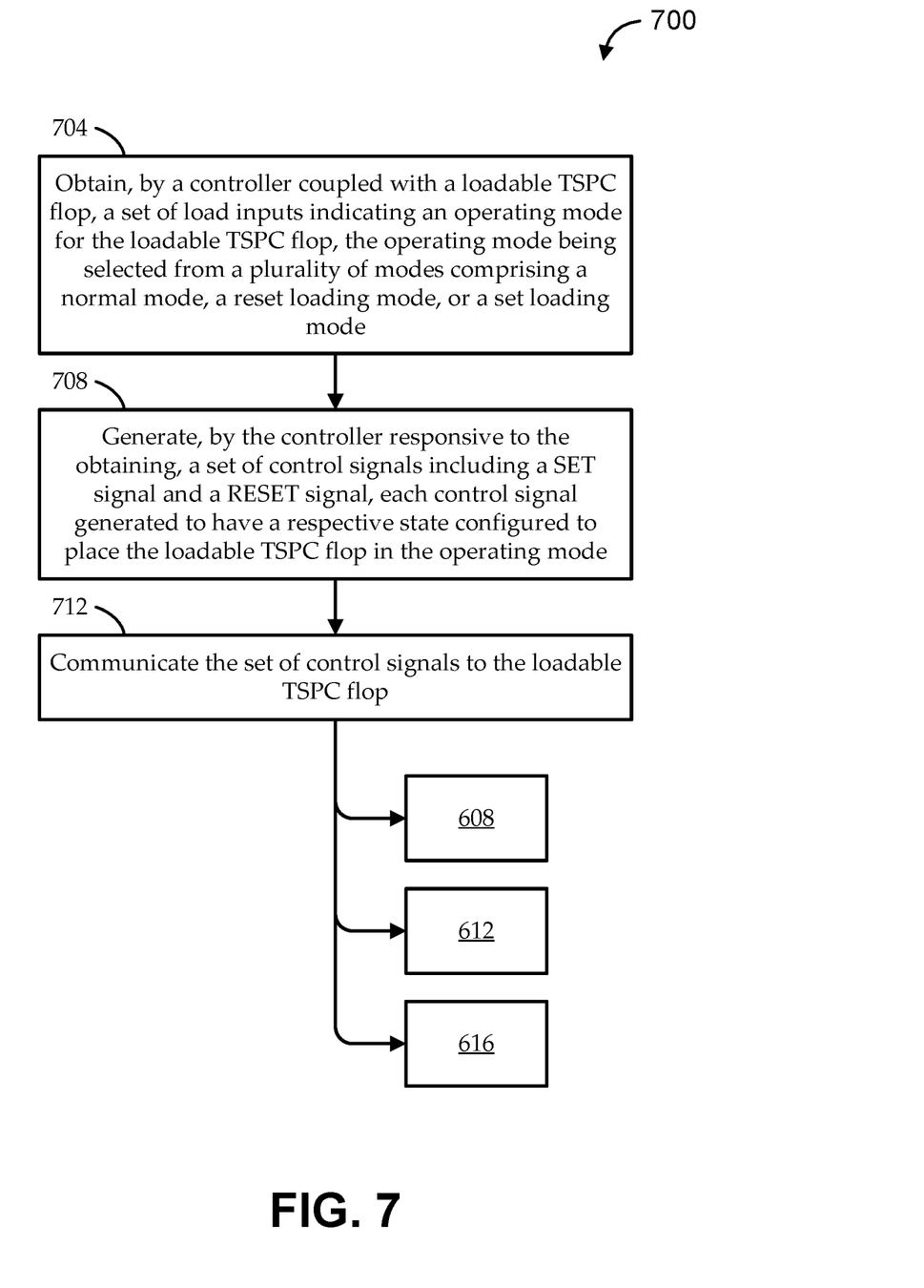
FIG. 7 shows a flow diagram of another method for generating TSPC flop functionality with optional loading, according to various embodiments.

FIG. 7 shows a flow diagram of another method 700 for generating TSPC flop functionality with optional loading, according to various embodiments. Embodiments of the method 700 can operate in context of any of the loadable TSPC flop implementations described above. For example, the loadable TSPC flop includes at least an input circuit block, a loadable pre-charge circuit block, and an output circuit block. The loadable pre-charge circuit block can include a precharge network and a set/reset (S/R) toggle block. The loadable TSPC flop can have a D input node and a Qb output node, and can be configured to receive a clock input signal and a set of control signals, including a SET signal and a RESET signal.

Embodiments of the method 700 can begin at stage 704 by obtaining, by a controller coupled with a loadable TSPC flop, a set of load inputs indicating an operating mode for the loadable TSPC flop, the operating mode being selected from a plurality of modes comprising a normal mode, a reset loading mode, or a set loading mode. At stage 708, embodiments can generate, by the controller responsive to the obtaining, a set of control signals including a SET signal and a RESET signal, each control signal generated to have a respective state configured to place the loadable TSPC flop in the operating mode. At stage 712, embodiments can communicate the set of control signals to the loadable TSPC flop.

Responsive to the communicating at stage 712, the loadable TSPC flop can be configured into whichever of the operating modes corresponds to the set of control signals. For example, similar to the description of stage 608 of FIG. 6, responsive to the control signals being configured to place the loadable TSPC flop in the normal mode, the control signals cause a precharge network of the loadable TSPC flop to be set to set to a running mode and cause a S/R toggle block of the loadable TSPC flop to be set to an off mode, such that an output node of the loadable TSPC flop toggles responsive to the clock input signal. Similar to the description of stage 612 of FIG. 6, responsive to the set of control signals being configured to place the loadable TSPC flop in the reset loading mode, the control signals cause the S/R toggle block to be set to a reset toggle mode, such that the output node is loaded to a predetermined reset value. Similar to the description of stage 616 of FIG. 6, responsive to the set of control signals being configured to place the loadable TSPC flop in the set loading mode, the control signals cause the S/R toggle block to be set to a set toggle mode, such that the output node is loaded to a predetermined set value that is a complement of the predetermined reset value.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A loadable true-single-phase-clocking (TSPC) flop, comprising:
 a set of input nodes to receive an input clock signal and control signals, the control signals including a SET signal and a RESET signal, the set of control signals configurable to direct the loadable TSPC flop into a selected one of a normal mode, a reset loading mode, or a set loading mode;
 an input circuit block coupled between a data input node and a first intermediate node;
 an output circuit block coupled between a second intermediate node and an output node; and
 a loadable pre-charge circuit block, having a precharge network and a set/reset toggle block, coupled between the first intermediate node and the second intermediate node,
 wherein the set of control signals direct the loadable TSPC flop into the normal mode by at least setting the precharge network to a running mode and setting the S/R toggle block to an off mode, such that the output node toggles responsive to the clock input signal,
 wherein the set of control signals direct the loadable TSPC flop into the reset loading mode by at least setting the S/R toggle block to a reset toggle mode, such that the output node is loaded to a predetermined reset value, and
 wherein the set of control signals direct the loadable TSPC flop into the set loading mode at least by setting the S/R toggle block to a set toggle mode, such that the output node is loaded to a predetermined set value that is a complement of the predetermined reset value.

2. The loadable TSPC flop of claim 1, wherein the output node is coupled with the data input node.

3. The loadable TSPC flop of claim 1, wherein the S/R toggle block comprises:
- a first switch coupled between a HIGH voltage reference and the second intermediate node; and
- a second switch coupled between a LOW voltage reference and the second intermediate node,
- wherein setting the S/R toggle block to the off mode comprises turning OFF the first switch and turning OFF the second switch responsive to the SET signal and/or the RESET signal,
- wherein setting the S/R toggle block to the reset toggle mode comprises turning OFF the first switch and turning ON the second switch responsive to the SET signal and/or the RESET signal, and
- wherein setting the S/R toggle block to the set toggle mode comprises turning ON the first switch and turning OFF the second switch responsive to the SET signal and/or the RESET signal.

4. The loadable TSPC flop of claim 1, wherein the precharge network comprises:
- a first switch and a second switch coupled in series between a HIGH voltage reference and the second intermediate node, the first switch configured to be ON when the loadable TSPC flop is not in the reset loading mode, and the second switch configured to be OFF when the input clock signal is HIGH and ON when the input clock signal is LOW; and
- a third switch and a fourth switch coupled in series between a LOW voltage reference and the second intermediate node, the third switch configured to be ON when the first intermediate node is HIGH, and the fourth switch configured to be ON when the input clock signal is HIGH and OFF when the input clock signal is LOW.

5. The loadable TSPC flop of claim 1, wherein:
the precharge network comprises a first subnetwork coupled between the second intermediate node and a HIGH voltage reference, and a second subnetwork coupled between the second intermediate node and a LOW voltage reference;
the set of control signals direct the loadable TSPC flop into the reset loading mode further by turning OFF the first subnetwork and the second subnetwork irrespective of a state of the input clock signal; and
the set loading mode comprises:
- a high-clock set loading mode, wherein the set of control signals direct the loadable TSPC flop into the high-clock set loading mode further by turning OFF the first subnetwork and the second subnetwork when the state of the input clock signal is HIGH; and
- a low-clock set loading mode, wherein the set of control signals direct the loadable TSPC flop into the low-clock set loading mode further by turning OFF the second subnetwork and turning ON the first subnetwork when the state of the input clock signal is LOW.

6. The loadable TSPC flop of claim 1, wherein:
the output circuit block operates, with the loadable TSPC flop in the reset loading mode, to turn ON a first current path responsive to the setting the S/R toggle block to the reset toggle mode defining a first state of the second intermediate node, and to turn OFF a second current path responsive to a first state of the SET signal, thereby pulling the output node HIGH; and
the output circuit block operates, with the loadable TSPC flop in the set loading mode, to turn OFF the first current path responsive to the setting the S/R toggle block to the set toggle mode defining a second state of the second intermediate node that is complementary to the first state of the second intermediate node, and to turn ON the second current path responsive to a second state of the SET signal that is complementary to the first state of the SET signal, thereby pulling the output node LOW.

7. The loadable TSPC flop of claim 1, wherein:
the input circuit block operates to pull the first intermediate node LOW responsive to the SET signal being HIGH.

8. The loadable TSPC flop of claim 1, wherein:
the control signals further include a "clk_1" signal that is: LOW when the loadable TSPC flop is in the normal mode and the input clock signal is LOW, LOW when the loadable TSPC flop is in the normal mode and the input clock signal is HIGH, LOW when the loadable TSPC flop is not in the normal mode and the input clock signal is LOW, and HIGH when the loadable TSPC flop is not in the normal mode and the input clock signal is HIGH; and
the input circuit block operates to pull the first intermediate node LOW responsive to the clk_1 signal being HIGH.

9. The loadable TSPC flop of claim 1, wherein at least a portion of the set of input nodes is configured to couple with a controller that generates the control signals responsive to a load signal indicating whether to direct the loadable TSPC flop into either the normal mode, or one of the reset loading mode or the set loading mode.

10. The loadable TSPC flop of claim 1, wherein:
the loadable TSPC flop is one of a chain of N loadable TSPC flops chained together with the output node of each nth loadable TSPC flop coupled to the clock input node of the (n+1)th loadable TSPC flop, wherein N is an integer greater than 1.

11. A method for generating TSPC flop functionality with selectable loading, the method comprising:
obtaining, by a loadable TSPC flop, a clock input signal and a set of control signals, including a SET signal and a RESET signal, the loadable TSPC flop having a data input node and an output node, the set of control signals configured to place the loadable TSPC flop in a selected one of a normal mode, a reset loading mode, or a set loading mode;
responsive to the set of control signals configured to place the loadable TSPC flop in the normal mode, setting a precharge network of the loadable TSPC flop to a running mode and setting a S/R toggle block of the loadable TSPC flop to an off mode, such that the output node toggles responsive to the clock input signal;
responsive to the set of control signals configured to place the loadable TSPC flop in the reset loading mode, setting the S/R toggle block to a reset toggle mode, such that the output node is loaded to a predetermined reset value; and
responsive to the set of control signals configured to place the loadable TSPC flop in the set loading mode, setting the S/R toggle block to a set toggle mode, such that the output node is loaded to a predetermined set value that is a complement of the predetermined reset value.

12. The method of claim 11, further comprising:
updating a state of the data input node responsive to a change in state of the output node.

13. The method of claim 11, wherein:
the S/R toggle block comprises a first switch coupled between a HIGH voltage reference and the second intermediate node, and a second switch coupled between a LOW voltage reference and the second intermediate node;
setting the S/R toggle block to the off mode comprises turning OFF the first switch and turning OFF the second switch responsive to the SET signal and/or the RESET signal;
setting the S/R toggle block to the reset toggle mode comprises turning OFF the first switch and turning ON the second switch responsive to the SET signal and/or the RESET signal; and
setting the S/R toggle block to the set toggle mode comprises turning ON the first switch and turning OFF the second switch responsive to the SET signal and/or the RESET signal.

14. The method of claim 11, wherein:
the precharge network comprises:
a first switch and a second switch coupled in series between a HIGH voltage reference and the second intermediate node; and
a third switch and a fourth switch coupled in series between a LOW voltage reference and the second intermediate node;
the second switch is configured to be OFF when the input clock signal is HIGH and ON when the input clock signal is LOW;
the fourth switch is configured to be ON when the input clock signal is HIGH and OFF when the input clock signal is LOW;
responsive to the set of control signals configured to place the loadable TSPC flop in the normal mode, setting the precharge network to the running mode by turning the first switch ON;
responsive to the set of control signals configured to place the loadable TSPC flop in the reset loading mode, further turning the first switch OFF; and
responsive to the set of control signals configured to place the loadable TSPC flop in the set loading mode, further turning the first switch ON.

15. The method of claim 11, wherein:
the precharge network comprises a first subnetwork coupled between the second intermediate node and a HIGH voltage reference, and a second subnetwork coupled between the second intermediate node and a LOW voltage reference;
responsive to the set of control signals configured to place the loadable TSPC flop in the normal mode, setting the precharge network to the running mode by turning ON the first subnetwork and the second subnetwork, such that a state of the second intermediate node is responsive to states of the input clock signal and the first intermediate node;
responsive to the set of control signals configured to place the loadable TSPC flop in the reset loading mode, further turning OFF the first subnetwork and the second subnetwork, such that a state of the second intermediate node is controlled by the S/R toggle block irrespective of the states of the input clock signal and the first intermediate node; and
responsive to the set of control signals configured to place the loadable TSPC flop in the set loading mode, further turning OFF at least the second subnetwork, such that a state of the second intermediate node is controlled by the S/R toggle block and/or the first subnetwork depending on the state of the input clock signal and irrespective of the state of the first intermediate node.

16. The method of claim 11, wherein:
responsive to the set of control signals configured to place the loadable TSPC flop in the reset loading mode, further setting the output circuit block to turn ON a first current path responsive to the setting the S/R toggle block to the reset toggle mode defining a first state of the second intermediate node, and to turn OFF a second current path responsive to a first state of the SET signal, thereby pulling the output node HIGH; and
responsive to the set of control signals configured to place the loadable TSPC flop in the set loading mode, setting the output circuit block to turn OFF the first current path responsive to the setting the S/R toggle block to the set toggle mode defining a second state of the second intermediate node that is complementary to the first state of the second intermediate node, and to turn ON the second current path responsive to a second state of the SET signal that is complementary to the first state of the SET signal, thereby pulling the output node LOW.

17. The method of claim 11, wherein the obtaining is from a controller that generates the control signals responsive to a load signal indicating whether to direct the loadable TSPC flop into either the normal mode, or one of the reset loading mode or the set loading mode.

18. A method for generating TSPC flop functionality with selectable loading, the method comprising:
obtaining, by a controller coupled with a loadable TSPC flop, a set of load inputs indicating an operating mode for the loadable TSPC flop, the operating mode being selected from a plurality of modes comprising a normal mode, a reset loading mode, or a set loading mode;
generating, by the controller responsive to the obtaining, a set of control signals including a SET signal and a RESET signal, each control signal generated to have a respective state configured to place the loadable TSPC flop in the operating mode; and
communicating the set of control signals to the loadable TSPC flop, such that:
responsive to the set of control signals configured to place the loadable TSPC flop in the normal mode, the control signals cause a precharge network of the loadable TSPC flop to be set to set to a running mode and cause a S/R toggle block of the loadable TSPC flop to be set to an off mode, such that an output node of the loadable TSPC flop toggles responsive to the clock input signal;
responsive to the set of control signals configured to place the loadable TSPC flop in the reset loading mode, the control signals cause the S/R toggle block to be set to a reset toggle mode, such that the output node is loaded to a predetermined reset value; and
responsive to the set of control signals configured to place the loadable TSPC flop in the set loading mode, the control signals cause the S/R toggle block to be set to a set toggle mode, such that the output node is loaded to a predetermined set value that is a complement of the predetermined reset value.

* * * * *